United States Patent
Lee et al.

(10) Patent No.: US 11,078,428 B2
(45) Date of Patent: Aug. 3, 2021

(54) GENERATING A SOFT SENSOR FOR CRUDE STABILIZATION IN THE PETROLEUM INDUSTRY

(71) Applicant: Saudi Arabian Oil Company, Dhahran (SA)

(72) Inventors: Shuyee Lee, Abqaiq (SA); Omar Al-Mohisin, Khobar (SA); Mohammed Al-Saeed, Abqaiq (SA)

(73) Assignee: Saudi Arabian Oil Company, Dhahran (SA)

( * ) Notice: Subject to any disclaimer, the term of this patent is extended or adjusted under 35 U.S.C. 154(b) by 992 days.

(21) Appl. No.: 15/670,679

(22) Filed: Aug. 7, 2017

(65) Prior Publication Data

US 2019/0040323 A1    Feb. 7, 2019

(51) Int. Cl.
| | | |
|---|---|---|
| *C10G 7/12* | (2006.01) | |
| *G05B 19/414* | (2006.01) | |
| *G01K 7/02* | (2021.01) | |
| *C10G 7/02* | (2006.01) | |
| *H01L 43/08* | (2006.01) | |
| *G01L 19/00* | (2006.01) | |
| *G05B 13/04* | (2006.01) | |
| *C01B 17/16* | (2006.01) | |
| *G01K 13/02* | (2021.01) | |

(52) U.S. Cl.
CPC ............... *C10G 7/12* (2013.01); *C10G 7/02* (2013.01); *G01K 7/02* (2013.01); *G01L 19/0092* (2013.01); *G05B 13/04* (2013.01); *G05B 19/4148* (2013.01); *H01L 43/08* (2013.01); *C01B 17/16* (2013.01); *G01K 13/026* (2021.01)

(58) Field of Classification Search
CPC .................................. C01B 17/16; C10G 7/02
See application file for complete search history.

(56) References Cited

U.S. PATENT DOCUMENTS

| | | |
|---|---|---|
| 8,250,006 B2 | 8/2012 | Smits et al. |
| 8,429,100 B2 | 4/2013 | Jang et al. |
| 8,572,155 B2 | 10/2013 | Yanovich et al. |

(Continued)

OTHER PUBLICATIONS

Fayruzov D KH et al., Advanced process control system for a crude distillation unit. A case study, (2017), Automation and Remote Control, vol. 78, No. 2, pp. 357-367 (Year: 2017).*

(Continued)

*Primary Examiner* — Manuel A Rivera Vargas
*Assistant Examiner* — Yaritza H Perez Bermudez
(74) *Attorney, Agent, or Firm* — Fish & Richardson P.C.

(57) ABSTRACT

A global theoretical graphical representation of a soft sensor is generated based on a cursory model, where the soft sensor is used to control crude stabilization. A plurality of local real-life graphical representations are generated for the soft sensor, each of the plurality of local real-life graphical representations corresponding to a respective local regime. A global real-life graphical representation is generated for the soft sensor by combining the plurality of local real-life graphical representations. A set of numerical values for the soft sensor are generated based on the global real-life graphical representation. The soft sensor is updated based on lab results and a crude stabilization operation is controlled using the soft sensor.

17 Claims, 9 Drawing Sheets

(56) References Cited

U.S. PATENT DOCUMENTS

| | | | | |
|---|---|---|---|---|
| 8,869,890 | B2* | 10/2014 | Chinn | E21B 43/34 |
| | | | | 166/105.5 |
| 2010/0242362 | A1* | 9/2010 | Van Amelsvoort | B01D 3/14 |
| | | | | 48/127.3 |
| 2011/0295777 | A1* | 12/2011 | Jang | G05B 23/0221 |
| | | | | 706/12 |
| 2014/0214733 | A1 | 7/2014 | Alonso et al. | |
| 2015/0184932 | A1* | 7/2015 | Higginbotham | F25J 3/0209 |
| | | | | 62/620 |
| 2017/0097330 | A1* | 4/2017 | Mann | G01N 21/33 |
| 2017/0121610 | A1* | 5/2017 | Niccum | C10G 33/06 |
| 2017/0269559 | A1* | 9/2017 | Trygstad | G01V 11/00 |
| 2018/0187095 | A1* | 7/2018 | Soliman | B01D 19/0068 |
| 2019/0040323 | A1* | 2/2019 | Lee | G05B 19/4148 |
| 2019/0105602 | A1* | 4/2019 | Bhuwania | C01B 17/0408 |
| 2020/0165528 | A1* | 5/2020 | Nanda | C10G 33/06 |

OTHER PUBLICATIONS

Fayruzov et al., "Advanced process control system for a crude distillation unit. A case study," Automation and Remote Control, Plenum, Publ. Co, vol. 78, No. 2, Feb. 12, 2017, 11 pages.

International Search Report and Written Opinion issued in International Application No. PCT/US2018/044092 dated Oct. 29, 2018, 15 pages.

J. Deng et al.; "Development and industrial application of soft sensors with on-line Bayesian model updating strategy", Journal of Process Control 23 (2013) pp. 317-325.

Z. Ge et al., "A comparative study of just-in-time-learning based methods for onlin soft sensor modeling", Chemometrics and Intelligent Laboratory Systems 104 (2010) pp. 306-317.

J.C.B. Gonzaga et al., "ANN-based soft-sensor for real-time process monitoring and control of an industrial polymerization process", Computers and Chemical Engineering 33 (2009) pp. 43-49.

P. Kadlec et al., "Data-driven Soft Sensors in the process industry", Computers and Engineering 33 (2009) pp. 795-814.

M. Kano et al., "Inferential control system of distillation compositions using dynamic partial least squares regression", Journal of Process Control 10 (2000) pp. 157-166.

S. Lee et al., "Employing First Principles Model-Based Soft Sensors for Superior Process Control and Optimization", IPTC International Petroleum Technology Conference; IPTC 16604, 2013, pp. 4.

GCC Examination Report in GCC Appln. No. GC2018-35776, dated Jan. 11, 2020, 4 pages.

GCC Examination Report in GCC Appln. No. GC2018-35776, dated Oct. 4, 2020, 4 pages.

GCC Examination Report in GCC Appln. No. GC2018-35776, dated Feb. 21, 2021, 5 pages.

* cited by examiner

GENERATING A SOFT SENSOR FOR CRUDE STABILIZATION IN THE PETROLEUM INDUSTRY

TECHNICAL FIELD

This disclosure relates to generating a soft sensor for crude stabilization.

BACKGROUND

In the context of petroleum industry, crude stabilization refers to a process that performs two functions at the same time: it sweetens sour crude oil by removing hydrogen sulfide ($H_2S$) and reduces vapor pressure by removing other light hydrocarbon gases such as methane, ethane, propane, and butane, thereby making the crude oil safe for shipment and storage. Without real-time measurements of critical processing parameters, effective quality control and energy optimization in the crude stabilization process may be difficult to achieve.

SUMMARY

The present disclosure describes generating a soft sensor for crude stabilization.

In an implementation, a computer-implemented method, comprising: generating a global theoretical graphical representation of a soft sensor based on a cursory model, wherein the soft sensor is used to control crude stabilization; generating a plurality of local real-life graphical representations for the soft sensor, each of the plurality of local real-life graphical representations corresponding to a respective local regime; generating a global real-life graphical representation for the soft sensor by combining the plurality of local real-life graphical representations; generating a set of numerical values for the soft sensor based on the global real-life graphical representation; updating the soft sensor based on lab results; and controlling a crude stabilization operation using the soft sensor.

The previously described implementation is implementable using a computer-implemented method; a non-transitory, computer-readable medium storing computer-readable instructions to perform the computer-implemented method; and a computer-implemented system comprising a computer memory interoperably coupled with a hardware processor configured to perform the computer-implemented method/ the instructions stored on the non-transitory, computer-readable medium.

The subject matter described in this specification can be implemented in particular implementations, so as to realize one or more of the following advantages. Generating and updating soft sensors using the method and process described in the disclosure can enable automatic control of the crude stabilization process in the petroleum industry. Using the soft sensors described in the disclosure in the automatic control can improve oil processing operations and provide better quality control, more stable and reliable operation, and increased energy savings. Implementation of the soft sensor can automate the target adjustment process in the oil production operation and reduce operator adjustments or interventions. Other advantages will be apparent to those of ordinary skill in the art.

The details of one or more implementations of the subject matter of this specification are set forth in the accompanying drawings and the description. Other features, aspects, and advantages of the subject matter will become apparent from the description, the drawings, and the claims.

DESCRIPTION OF DRAWINGS

Like reference numbers and designations in the various drawings indicate like elements.

DETAILED DESCRIPTION

Figure 1:
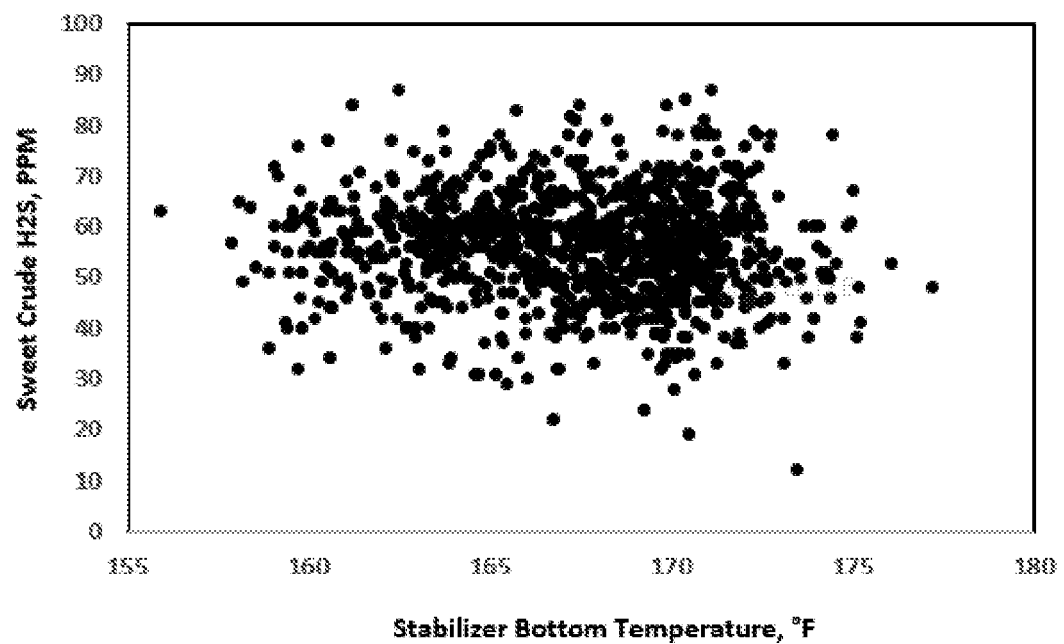
FIG. 1 illustrates an example data set for laboratory $H_2S$ and stabilizer bottom temperature, according to an implementation.

The following detailed description describes generating soft sensors for crude stabilization and is presented to enable any person skilled in the art to make and use the disclosed subject matter in the context of one or more particular implementations. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail inasmuch as such details are within the skill of one of ordinary skill in the art. The present disclosure is not intended to be limited to the described or illustrated implementations, but to be accorded the widest scope consistent with the described principles and features.

In some implementations, a crude stabilization column can have 14 glitch valve trays. The sour crude feed enters the column at the top tray—tray 14. Heating the sour crude causes $H_2S$ and other light hydrocarbons to leave the crude oil in the form of vapor that rises through the stabilization column and exits the top. The hot vapor then goes to the natural gas liquids (NGL) plant for further processing, and the stabilized (sweet) crude oil is cooled and sent for further processing, or sent to storage. The heating medium for the stabilizer can be 60-psig steam passing through the tube-side of 2 to 4 reboilers. The 60-psig steam at 325° F. can also be injected directly into the crude oil feed lines to the reboilers. The injection of steam helps separate the gas from the oil by lowering the boiling temperature of the oil.

The amount of $H_2S$ in the sweet crude is an important operating parameter in the stabilization process because it is related to toxic or corrosive hazards and a key parameter to optimize the costs and yields associated with the stabilization, NGL, and downstream refining processes. In some cases, the $H_2S$ operating target can vary from 1 ppm to 60 ppm. Another important operating parameter is true vapor pressure (TVP), which is the equilibrium partial pressure exerted by the sweet crude oil at a given temperature. The TVP is tied to tendencies of vapor lock, pump cavitation, air pollution, and other factors, and thus it may be difficult to obtain accurate TVP. In some cases, the Reid vapor pressure (RVP), obtained based on the test method ASTM D-323, can be used instead of the TVP.

It is difficult to perform online $H_2S$ and RVP analysis because the analyzers' performance and reliability due to significant maintenance and special expertise required. Consequently, laboratory analysis has been used to loosely monitor and control the $H_2S$ and RVP values. Without real-time measurements of these critical values, effective quality control and energy optimization in the crude stabilization process is difficult to achieve due to low sampling rates, long time delay, and unreliable results associated with manual sampling and laboratory analysis. In some cases, a soft sensor can be used to compute the sweet crude's real-time $H_2S$ and RVP values.

Soft sensor, sometimes also referred to as virtual sensor or virtual analyzer, is software that uses multiple easily measured process variables, for example, temperatures, pressures, and flows, as inputs to compute key process variables or product qualities that are difficult to measure directly. The easy-to-measure variables are related to the difficult-to-measure process variables so a mathematical model, for example, the inferential model or soft sensor model, of the process can be identified based on the underlying relationships of the variables. Soft sensors can be used to replace online analyzers with high maintenance costs, short life spans, inaccurate readings, and for variables where evaluation involves manual sampling and laboratory analysis.

In the process of soft sensor development, inferential model construction is an important step. Generally, inferential model development techniques can be classified into two major categories: model-driven and data-driven. Model-driven soft sensors can be built when the underlying physical and chemical principles of the process are well understood. Since most industrial processes are quite complex to model, a rigorous theoretical modelling approach is often impractical or even impossible due to a lack of the full phenomenological knowledge about the process. In these cases, obtaining the inferential model based on the measured data using data-driven techniques may be a useful option, in particular because a large amount of operating data can be collected, stored, and analyzed using modern measurement techniques.

Empirical regression models can be derived from a large amount of data using various modeling techniques, such as multivariate statistics and artificial neural networks. This data-driven approach is also called black-box techniques because the model itself has no knowledge about the process and is solely based on empirical observations of the physical measurements. In some implementations, off-the-shelf soft sensor modeling packages and advanced data analytics packages have been used in an attempt to develop good inferential models for estimation of the sweet crude's real-time ELS and RVP values. Examples of modeling techniques used include Linear Regression, Linear PLS (Partial Least Squares), Nonlinear Regression, Nonlinear Fuzzy PLS, Nonlinear Least Squares, Hybrid PLS and Neural Networks, and Monotonic Neural Networks.

However, the results from the data-driven model are disappointing. The problem may be a lack of high quality representative data. In addition to significant measurement uncertainty and random error embedded in the laboratory data due to manual sampling and analysis, the historical data was found sample rich but information poor. Because operators have always adjusted operating conditions to keep $H_2S$ and RVP close to their operating targets, normal day-to-day operation does not provide enough movement or variation in the data (especially the output variables) to warrant viable inferential models developed from the data-driven techniques that heavily rely on a vast amount of high-quality information-rich data. In this case, variation observed in the data was more likely due to random errors than to change in operating conditions. For instance, stabilizer bottom temperature is a handle for operators to regulate the sweet crude's $H_2S$ at a given steam injection ratio, that is, increasing the bottom temperature reduces the $H_2S$ content.

FIG. 1 illustrates an example data set 100 for laboratory $H_2S$ and stabilizer bottom temperature, according to an implementation. The data shown in FIG. 1 include approximately three years of laboratory $H_2S$ and stabilizer bottom temperature data for steam injection ratio, at constant 13 PPH/MBD. While the data may vaguely reveal lower sweet crude $H_2S$ resulted from higher stabilizer bottom temperature, the precise mathematical relationship is difficult to discern. In contrast, arbitrary and wrong correlation or inferential model may be drawn from these seemingly random data points. This figure highlights the data analysis challenge associated with imprecise and poor quality data frequently encountered in the industrial data sets and processes.

Furthermore, as the model is the engine of the soft sensor, the decision of model structure and model coefficients dictates the relationships between the easy-to-measure input variables and the difficult-to-measure output variables, which determines the generalization abilities and performance of the soft-sensor. Without a unified approach, the model structure and coefficients are often selected in an ad hoc manner for each soft sensor. Some data-driven modeling techniques such as neural networks may not rely on any assumption on the model structure and coefficients. For this particular case, multiple layers of interconnected artificial neurons nonlinearly transform the incoming values using an activation function and then distribute the result to the other neurons. The model structure and coefficients are encoded in the connection weights, and the weights are adjusted to minimize the error between the network outputs and the targets. While including large numbers of input variables and regression coefficients may make it easier to yield a good empirical regression model, the obtained model represents only a mathematical correlation, not the process characteristics under a wide range of operating conditions.

In some implementations, the previously mentioned drawbacks can be overcome by using a systematic approach to build $H_2S$ and RVP soft sensors from imprecise, poor quality industrial data obtained in the crude stabilization process. The systematic approach can take advantage of on the complementary relationship between the model-driven and data-driven modeling techniques to generate model-free multivariable nonlinear soft sensors in the crude stabilization process without resorting to special soft sensor modeling or data analytics packages. FIGS. 2-9 and associated descriptions provide additional details of these implementations. In some cases, this approach is described in the context of developing H₂S soft sensors in a distributed control system (DCS) from the historical data that contains significant measurement uncertainty and random error. The same approach can be used to develop RVP soft sensors where laboratory RVP data is used instead of laboratory H₂S data.

Generally, it is time-consuming and difficult to build a high performance data-driven soft sensor, since a vast amount of high quality accurate data has to be available, correct input variables have to be selected, appropriate model structures have to be determined, and model coefficients have to be identified with data rich inferential information. The approach disclosed here can be used to effectively build multivariable nonlinear robust soft sensors for crude stabilization as well as other manufacturing processes from the historical data that contains large measurement uncertainty and random error where traditional soft sensor development techniques fail to deliver acceptable results.

Figure 2:
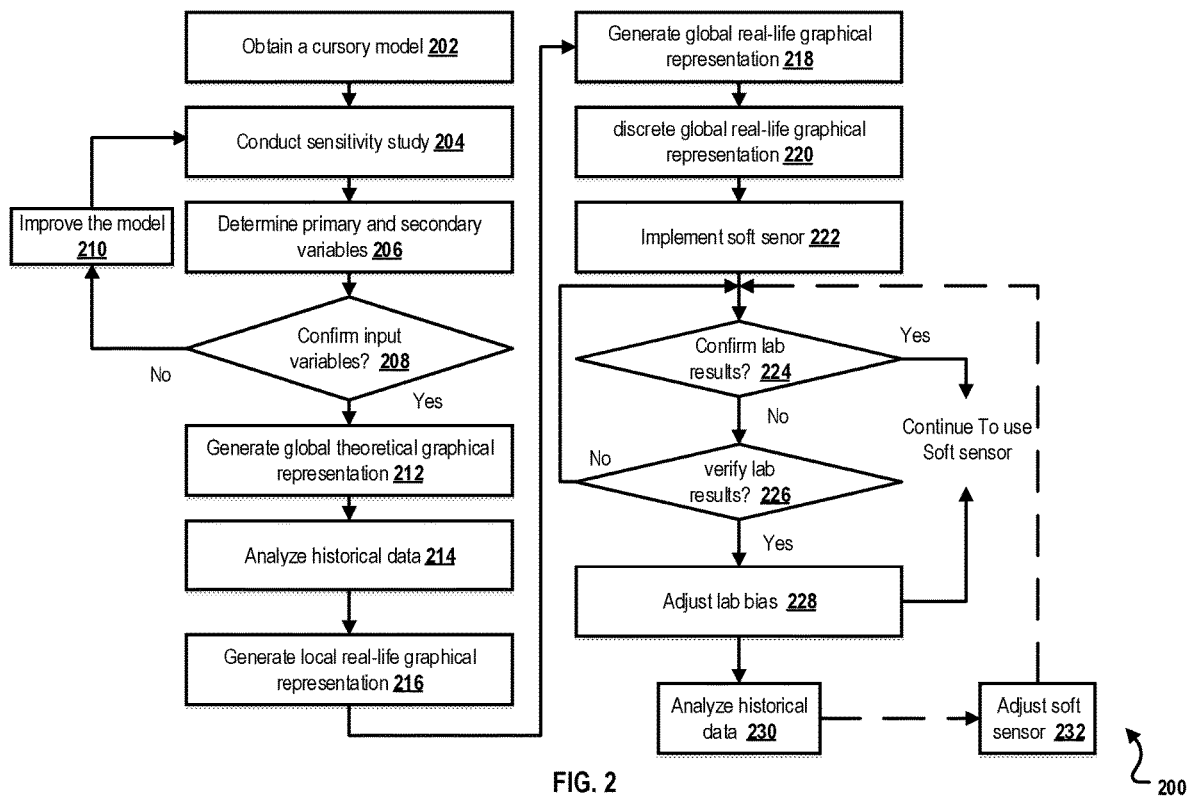
FIG. 2 is a flowchart illustrating an example process for developing a soft sensor, according to an implementation.

FIG. 2 is a flowchart illustrating an example process 200 for developing a soft sensor, according to an implementation. For clarity of presentation, the description that follows generally describes process 200 in the context of the other figures in this description. However, it will be understood that process 200 may be performed, for example, by any suitable system, environment, software, and hardware, or a combination of systems, environments, software, and hardware, as appropriate. In some implementations, various steps of process 200 can be run in parallel, in combination, in loops, or in any order.

At 202, a cursory model is obtained. The cursory model can be a first-principles simulation model that is a low or medium-fidelity, general purpose, simulation model. In some cases, the cursory model can be obtained using commercial process modeling tools such as HYSYS. Process parameters such as feed composition, number of trays can be used as inputs to the tools and the cursory model can be obtained as the output.

If the first principles model can describe the process accurately, a model-driven soft sensor can be easily derived. However, development of such a high-fidelity model for an H₂S or RVP soft sensor is difficult. Most first principles models are primarily developed for the purpose of planning and development of process plants, and therefore usually focus on the description of prominent process variables such as flows, temperatures, and pressures, but not subtle quality variables such as the ppm level of H₂S.

In this case, the first principles model describes a simplified theoretical background and key characteristics of the process rather than the real-life situation, which is influenced by much more complex factors. For instance, in the case of crude stabilization, the H₂S and RVP values are affected by factors such as vapor-liquid mixing and separation on each tray that may not be simulated accurately even with modern modeling technology. In the process 200, the cursory first principles model captures the key underlying relationships and characteristics, for example, the effects of the stabilizer bottom temperature and steam injection ratio on the bottom H₂S value. The cursory model can predict a large effect of steam injection ratio on H₂S when the ratio is in the range of 0~5 PPH/MBD and small to no effects when the ratio is above 5 PPH/MBD. In practice, typical operating range of the steam injection ratio is 10~25 PPH/MBD, not 0~5 PPH/MBD as predicted by the model. Although the cursory model may not be acceptable to any model-driven soft sensor techniques due to this large discrepancy, the cursory model can be used for the process 200 that takes a hybrid approach.

From 202, the process 200 proceeds to 204, where sensitivity studies are conducted. The sensitivity study can be performed by running various simulation cases. The input to the sensitivity study can be different cases of input variables, and the output can be simulation results in the format of numerical values and graphics. For example, in one set of simulation cases, one particular input variable can take different values while all other variables take the same value. This simulation results of this set of simulation cases can indicate how this particular input variable affects output variables. Additional sets of simulation cases can be run to identify effects of other input variables.

Figure 3:
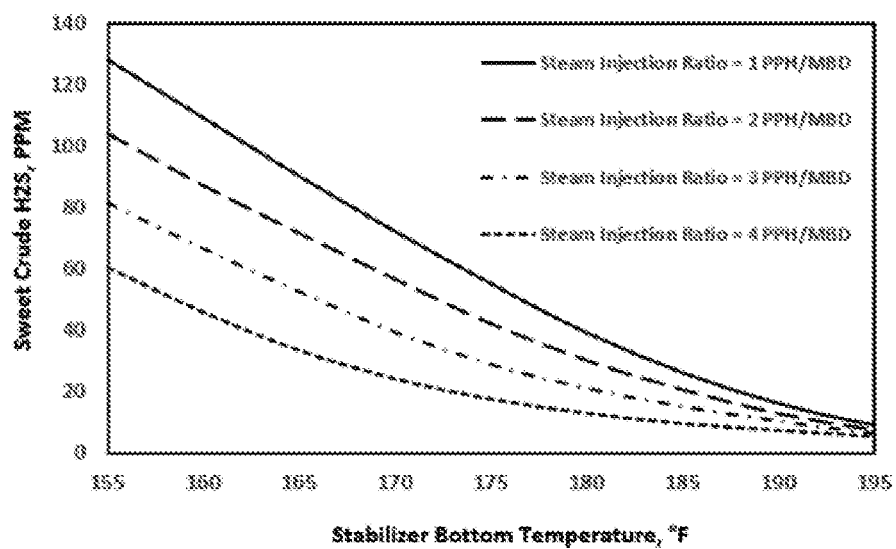
FIG. 3 illustrates an example global theoretical graphical representation for primary variables, according to an implementation.

From 204, the process 200 proceeds to 206, where the output (the numerical values) of the sensitivity studies is analyzed to determine the primary (important) and secondary (less important) input variables. In some cases, if an input variable has a relatively large effect on the output variable and the input variable has a highly nonlinear relationship with the output variable, the input variable can be classified as a primary input variable. Otherwise, the input variable can be classified as a secondary input variable. For example, as will be discussed in more detail later, the stabilizer bottom temperature shown in FIG. 3 is a primary input variable because it has a large highly nonlinear effect on the sweet crude H2S, as shown in a nonlinear curve instead of a straight line. The nonlinear effect is further compounded by interactions with the steam injection ratio, as shown in non-parallel curves.

From 206, the process 200 proceeds to 208, where the input variables and key underlying relationships are confirmed by historical data using data analytics techniques, such as hypothesis tests, correlation analysis, and factor analysis. Since the analysis is focused on the relationships and not absolute accuracy, the cursory model is sufficient. If the results of the sensitivity studies and the historical data analysis are not in agreement, the model likely does not capture the major characteristics of the crude stabilization process. In this case, the process 200 proceeds from 208 to 210, where the model has to be revisited and further improved to correctly reflect the characteristics. For instance, a process model used for the sensitivity study may initially use the Peng-Robinson equation of state to calculate thermodynamic properties, which yields fair RVP and TVP predictions but may fail to predict correct H2S characteristics. In contrast to the prediction by the process model, an increase in the stabilizer feed temperature may results in higher H2S value. Therefore, the process model can be further improved with different property packages of the process model. For example, a Non-Random Two-Liquid (NRTL) model can be used for predicting thermodynamic properties of the liquid phase and an ideal gas model can be used for the vapor phase, which yields fair RVP and correct H2S predictions. From 210, the process 200 proceeds to 204, where a sensitivity study is performed on the corrected model for further analysis and confirmation.

If the input variables and key underlying relationships are confirmed by the historical data, the process 200 proceeds from 208 to 212, where global theoretical graphical representation is generated.

In one example, four process variables that can impact the H₂S are identified at step 206 and confirmed at step 208. These four process variables are listed as following in descending order of importance: 1) Bottom temperature, ° F.; 2) Steam injection ratio, PPH/MBD; 3) Bottom pressure, PSIG; and 4) Feed temperature, ° F. Accordingly, the described four process variables are used as the input variables to develop the H₂S soft sensor. Among the variables, the bottom temperature and steam injection ratio have large effects on the $H_2S$ value. Thus, they can be two operating parameters adjusted to control the $H_2S$. Their operating ranges are relatively wide and their effects are highly nonlinear, which naturally constitutes the key underlying relationships that are characterized by the cursory model.

FIG. 3 illustrates an example global theoretical graphical representation 300 for primary variables, according to an implementation. As illustrated, a wide range of stabilizer bottom temperature and steam injection ratio conditions are performed in simulation based on the first-principles model. The simulations are conducted with feed temperature=115° F. and column overhead pressure=2.8 psig. The following characteristics are captured by the simulation results: a) $H_2S$ in sweet crude decreases with increasing stabilizer bottom temperature; b) $H_2S$ in sweet crude decreases with increasing steam injection ratio; and 3) the effects of a) and b) diminish rapidly as the operating regime approaches deep stabilization, which exhibits highly nonlinear relationships.

Returning to FIG. 2, from 212, the process 200 proceeds to 214, where historical plant and laboratory data are processed and analyzed. Examples of statistical analysis tools that can be used to process the historical data include clustering analysis, normality test, analysis of variance, statistical mean and median, confidence interval, or the like. The historical data is partitioned into several local regimes. The partition of the historical data can be performed by clustering analysis, where the observations among the historical data are grouped into subsets/clusters based on their similarity. Statistical analysis of data in each local regime is performed to estimate ranges of values.

In one example, the following four local regimes, also referred to as operational clusters, process states, or operating modes, are identified in Table 1:

TABLE 1

| Local regime | Bottom Temperature ° F. | Steam Injection Ratio PPH/MBD | Feed Temperature ° F. |
| --- | --- | --- | --- |
| 1 | 150~180 | ~13.0 | 115~117 |
| 2 | 155~185 | ~15.5 | 118~120 |
| 3 | 160~190 | ~18.0 | 107~108 |
| 4 | 170~200 | ~21.5 | 110~113 |

Figure 4:
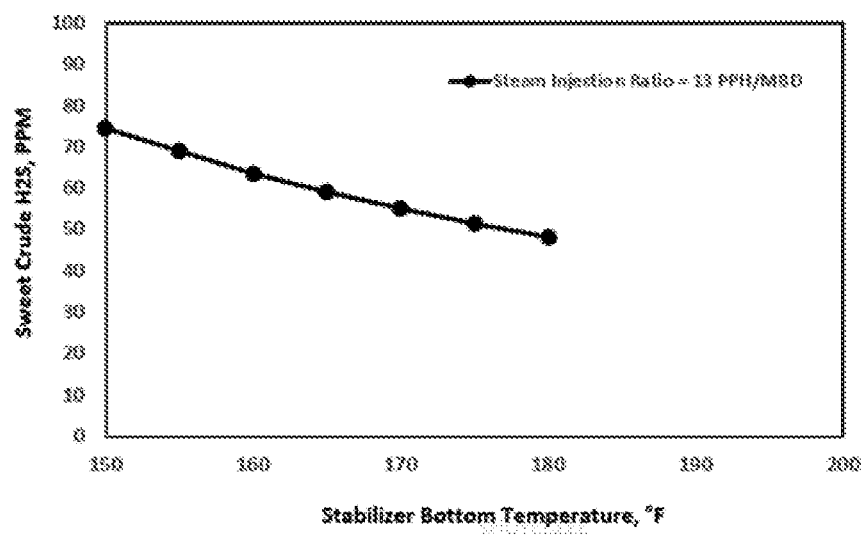
FIG. 4 illustrates an example local, real-life graphical representation, according to an implementation.
Figure 5:
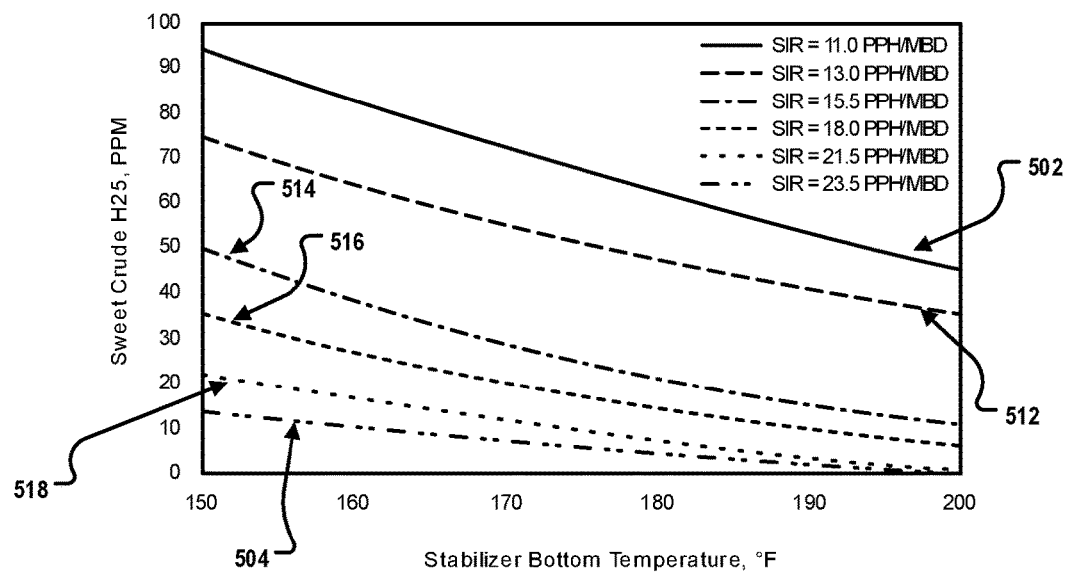
FIG. 5 illustrates an example global real-life graphic representation, according to an implementation.

From 214, the process 200 proceeds to 216, where a local graphical representation is generated for each of the obtained local regimes. Each local graphical representation describes the behavior of the process in a limited operating range of the highly nonlinear process. For example, within each of the four local regimes in Table 1, data points of adjacent bottom temperature values can be sub-grouped together by every increment of 5° F. Then, the statistical means, medians, and confidence intervals of the $H_2S$ and bottom temperature of all the subgroups are calculated. Based on the underlying relationships and characteristics determined based on the cursory model (as shown in FIG. 3), $H_2S$ and bottom temperature values can be selected to construct real-life graphical representation for the local regime. For example, as shown in FIG. 3, increased stabilizer bottom temperature leads to lower H2S in sweet crude and the process gain, defined as "change in the process output (H2S)" divided by "change in the process input, (Temperature)," decreases with increasing stabilizer bottom temperature. For a given bottom temperature, the process gain at a low steam injection ratio is larger than the corresponding process gain at a high steam injection ratio. These characteristics obtained in from FIG. 3 and the previous steps of the process 200 can serve as quantitative domain knowledge. Accordingly, data points can be selected to develop the soft sensor to exhibit these characteristics (quantitative domain knowledge). FIGS. 4-5 and associated descriptions provide additional details of these implementations FIG. 4 illustrates an example local real-life graphical representation 400, according to an implementation. The local real-life graphical representation represents the local regime with steam injection ratio at ~13 PPH/MBD. This hybrid statistical approach employs domain knowledge and data analytics synergistically to screen out uncertain, imprecise, misrepresentative data and remove random error from data analysis. Consequently, a robust high-performance inferential model can be developed from generally not high quality industrial data.

Returning to FIG. 2, from 216, the process 200 proceeds to 218, where a global real-life graphical representation is generated by combining the local real-life graphic representations for each local regimes.

FIG. 5 illustrates an example global real-life graphic representation 500, according to an implementation. The global real-life graphic representation 500 includes a local real-life graphic presentation for regime 1 as shown in FIG. 4 (line 512), as well as local real-life graphic representations for regimes 2-4 (lines 514, 516, and 518, representing Steam Injection Ratio=15.5, 18.0, and 21.4 PPH/MBD, respectively). In FIG. 5, the global real-life graphic representation also includes two additional lines 502 and 504 for steam injection ratios 11 PPH/MBD and 23.5 PPH/MBD. In some implementations, the two lines are generated by simple extrapolation from the four local real-life graphic representations.

FIGS. 3 and 5 have relatively similar curve shape, indicating that similar key underlying relationships and characteristics are captured by both figures. Their absolute values (Sweet Crude $H_2S$, Stabilizer Bottom Temperature, and Steam Injection Ratio) are different because a low/medium-fidelity first-principles model is used to construct FIG. 3, while selected data are selected in constructing the local and global real-life graphic representations shown in FIG. 5. Moreover, FIG. 3 is constructed by keeping all other relevant process variables constant (theoretical simulation), whereas FIG. 5 is constructed based on real-life data where other relevant process variables may not be constant.

Unlike a multiple model approach, where a complex and nonlinear process with a finite collection of simple sub-models and the local validity of each sub-model is defined by a weighting function that specifies the contribution of the sub-model to the approximation of the global representation of the nonlinear process, the approach used in the process 200 does not rely on a model structure or weighting function. Instead, multiple local graphical representations are directly merged without determining weight values or model coefficients.

Returning to FIG. 2, from 218, the process 200 proceeds to 220, where the global real-life graphical representation is discretized. The global real-life graphical representation can be discretized into arrays of numeric values. While the graphical representations can provide an easy way to visualize the underlying relationships and characteristics of the crude stabilization process and perform troubleshooting, the numeric values can be used in a DCS. In this example, because there are two primary input variables that have high nonlinear relationships to the output variable a two-dimensional array can be generated based on FIG. 5. If there are three primary input variables, a three-dimensional array can be generated.

Table 2 illustrates an example discretization of the global real-life graphical representation, according to an implementation. In some cases, the resolution can be selected based on the non-linearity of the relationship. For example, higher resolution (more data points) can be selected for higher nonlinear relationship. Table 2 is arranged in a two-dimensional array, where each $H_2S$ value corresponds to a SIR value in the same row and a stabilizer bottom temperature value in the same column:

TABLE 2

| Steam Injection Ratio, | Stabilizer Bottom Temperature, °F. | | | | | | | | | | |
|---|---|---|---|---|---|---|---|---|---|---|---|
| PPH/MBD | 150 | 155 | 160 | 165 | 170 | 175 | 180 | 185 | 190 | 195 | 200 |
| 11.0 | 94.1 | 87.8 | 82.2 | 76.8 | 72.1 | 66.9 | 62.5 | 57.9 | 54.0 | 49.6 | 45.3 |
| 13.0 | 74.5 | 68.9 | 63.5 | 59.1 | 55.0 | 51.5 | 48.0 | 44.5 | 41.5 | 38.3 | 35.5 |
| 15.5 | 50.0 | 44.0 | 38.0 | 33.0 | 28.3 | 24.0 | 20.3 | 18.0 | 15.2 | 12.7 | 11.0 |
| 18.0 | 35.7 | 30.8 | 26.5 | 22.9 | 19.5 | 16.8 | 14.0 | 11.6 | 9.1 | 7.2 | 5.6 |
| 21.5 | 21.7 | 18.5 | 16.0 | 13.5 | 11.4 | 9.2 | 7.1 | 5.1 | 3.3 | 1.8 | 0.7 |
| 23.5 | 13.5 | 11.8 | 10.0 | 8.4 | 6.9 | 5.4 | 3.8 | 2.5 | 1.4 | 0.7 | 0.0 |

In Table 2, each row of numeric values is equivalent to a real-life graphical representation for a particular local regime. Table 2 captures the relationships between the $H_2S$ value and the two primary values that are highly nonlinear (stabilizer bottom temperature and steam injection ratio) at typical bottom pressure and feed temperature. The typical bottom pressure (that is, 2.5 psig) and feed temperature (that is, 115° F.) are referred to as the reference bottom pressure and reference feed temperature, respectively. Deviations of the bottom pressure and feed temperature from the respective reference values may cause changes in the $H_2S$ value. Since the remaining two input variables (stabilizer bottom pressure and feed temperature) are normally within small operating ranges and their effects on the $H_2S$ value are relatively minor, their effects and relationships can be taken into account simply through the use of pressure compensation and temperature correction factors.

For example, in the operation of crude stabilization, temperature is often used as a process variable to infer product composition ($H_2S$), but changes in the column pressure can adversely affect the estimation of composition. Column temperature can change due to variations in column pressure at fixed composition. Consequently, a soft sensor, without considering the pressure variation, may interpret change in column pressure as change in composition and would present an incorrect value. In some cases, pressure-compensated temperature can be used as an inferred-composition variable to eliminate the effects of pressure on temperature, resulting in more accurate $H_2S$ estimation. Pressure-compensated bottom temperature can thus be calculated from bottom temperature and bottom pressure using the following equation:

$$\text{Pressure-Compensated Temperature} = \text{Temperature} - (P - P_{ref}) \times dT/dP \quad (1)$$

where P=Bottom Pressure, psig, $P_{ref}$=Reference Bottom Pressure, 2.5 psig, T=Bottom Temperature, °F., dT/dP=Pressure Compensation Factor=2.5~4.5° F./psig.

From 220, the process 200 proceeds to 222, where the model-free soft sensor obtained in step 220 is implemented in a DCS.

Figure 6:
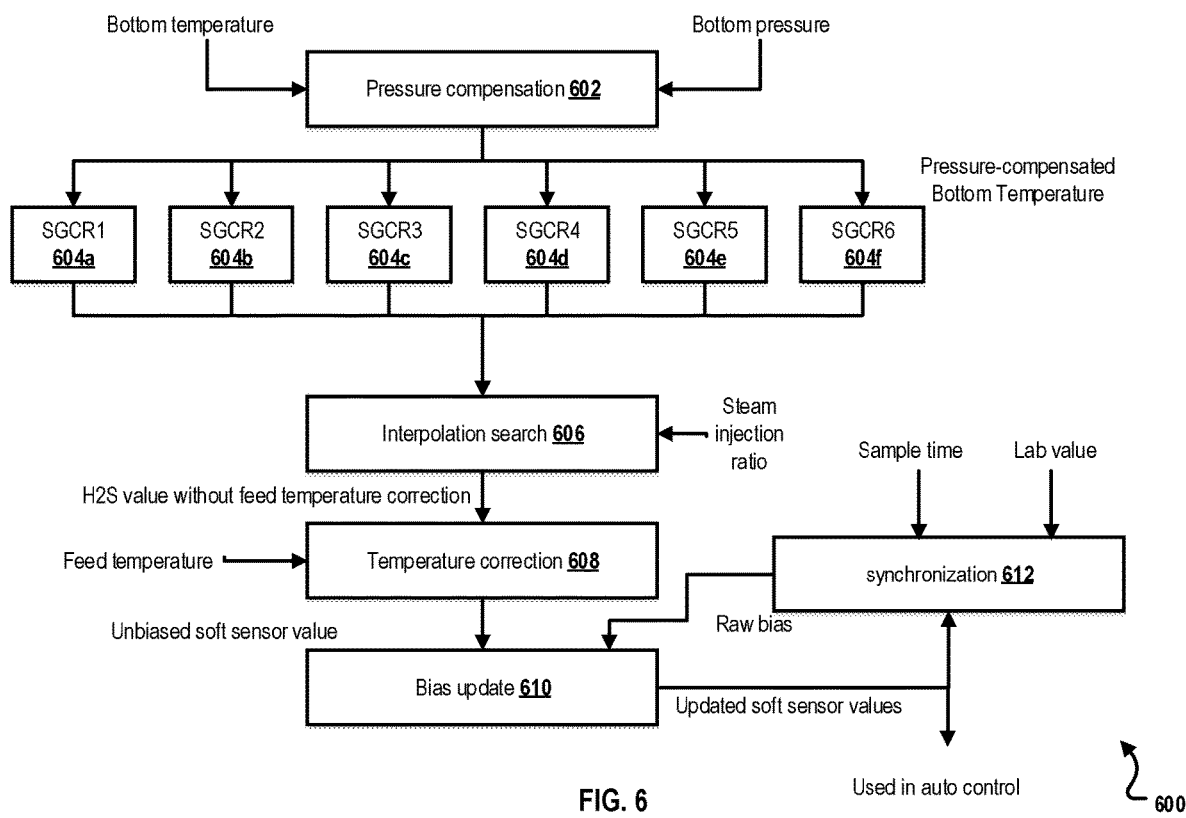
FIG. 6 illustrates an example model-free $H_2S$ soft sensor implementation, according to an implementation.

FIG. 6 illustrates an example model-free $H_2S$ soft sensor implementation 600, according to an implementation. In the illustrated example, the $H_2S$ soft sensor is implemented in a DELTAV DCS. FIG. 6 includes function blocks 602-612. Each function block represents an operation performed by the DCS system. As illustrated, the pressure compensation block 602 receives bottom temperature and bottom pressure as inputs and calculates the pressure-compensated bottom temperature, based on the Equation (1). The function blocks 604a-f (SGCR1-SGCR6) receive the pressure-compensated bottom temperature to calculate raw $H_2S$ values at different steam injection ratios (11.0, 13.0, 15.5, 18.0, 21.5, and 23.5), respectively. The raw $H_2S$ values are the $H_2S$ values without accounting for the effects of variation in feed temperatures on the $H_2S$. In the DCS implementation, a row of numeric values in Table 2 for a given steam injection ratio can be represented by a Signal Characterizer (SGCR) function block that approximates relationship function up to twenty X, Y coordinates. The function block interpolates an output value (raw $H_2S$ value) for a given input value (pressure-compensated bottom temperature) using the curve defined by the configured X, Y coordinates. In this example, six SGCR function blocks are used, each for a steam injection ratio. Because no pre-determined model structures or model coefficients are used, the soft sensor can be easily adapted or enhanced based on a few selected new data points, resulting in more robust and superior performance. To accomplish this, the twenty X, Y coordinates of the SGCR function blocks can be changed online while keeping the soft sensor continuously running without any disruption.

Once the raw $H_2S$ values are determined for various steam injection ratios at a given pressure-compensated bottom temperature, the interpolation search block 606 uses a linear interpolation search algorithm to determine the raw $H_2S$ value at the current steam injection ratio. The current steam injection ratio serves as an input to the interpolation search block 606. The raw $H_2S$ value obtained at this step has not been corrected for feed temperature variation, and thus the effects of feed temperature deviation from its reference temperature on the $H_2S$ value have not been accounted for.

The temperature correction block 608 takes into account the effects of changing feed temperature on $H_2S$ value using the following equation:

$$\text{Corrected } H_2S = \text{Uncorrected } H_2S + (T - T_{ref}) \times dH_2S/dT \quad (2),$$

where T=Feed Temperature, °F., $T_{ref}$=Reference Feed Temperature, 115° F., $H_2S$=Bottoms $H_2S$, ppm $dH_2S/dT$=Temperature Correction Factor, ppm/°F.

The temperature correction factor ($dH_2S/dT$) gradually changes from a positive value to 0 as the bottom temperature increases. In other words, the feed temperature effects become negligibly small when the operation mode changes from shallow stabilization to deep stabilization due to much higher bottom temperature used in deep stabilization. In this case, the temperature correction factor is a linear function of the pressure-compensated bottom temperature whose positive impact decreases proportionally with increased bottom temperature. The value is close to zero when the pressure-compensated bottom temperature approaches 190° F.

The output of the temperature correction block 608 is an unbiased soft sensor value. The unbiased soft sensor value is combined with a bias value, at the bias update block 610, to yield the updated soft sensor value, in this case the biased $H_2S$ value, which is used by the operating unit for quality control and energy optimization purposes. The raw bias value is a feedback value generated by the synchronization block 612. The bias update operation accounts for model inaccuracies, enhances the performance and reliability of the soft sensor, and provides additional information that can be used to evaluate the accuracy of the soft sensor. In some implementations, instead of updating a soft sensor bias directly using the raw bias value, statistical data analysis is performed on the raw bias value before updating the soft sensor. For example, a determination of whether the feedback error is statistically significant is performed. The soft sensor values are updated if the feedback error is determined to be statistically significant, and not updated if the feedback error is determined to be statistically insignificant. This approach can reduce the impact of noises or errors in the raw bias value. For example, analysis of 5 years of historical data shows that the soft sensor may have 6~8% relative error. Lab values that deviate from the soft sensor value significantly more than the normal relative error range can trigger a potential "outlier" flag and in response to the "outlier" flag, the lab values can be downgraded by clamping the raw bias limit or reducing the contribution weight of the raw bias. Also, the accumulated bias (discussed in more detail later) and statistical process control chart can be used to help decide if a particular lab value should be upgraded or downgraded. An example calculation for the final bias can be calculated based on the following equation: Final Bias= (1−w)*Current Bias+w*Raw Bias, where w represents the contribution weight of the new lab value in the range of 0~1. The w value increases in an upgrade and decreases in a downgrade.

As illustrated, the final soft sensor value is stored and historized in the synchronization block 612. The synchronization block 612 calculates the raw bias value using the following equation:

$$\text{raw bias value} = \text{laboratory } H_2S \text{ value} - \text{soft sensor } H_2S \text{ value} \quad (3).$$

Feedback from the laboratory takes into account the dynamic shifts between the data sources. The synchronization block 612 aligns the lab timestamp and historized soft sensor value to account for the time delay between the sample source and the soft sensor input signals sources. The synchronization block 612 keeps track of what the soft sensor value is when recorded at sample time and when the laboratory result later become available.

While FIG. 6 illustrates an example of $H_2S$ soft sensor implementations, other soft sensors, for example RVP, can also be implemented in the DCS.

Returning to FIG. 2, in some cases, some or all the steps 202-220 can be performed offline to generate the soft sensors. The soft sensors can be activated to compute real-time $H_2S$ from easily measured process variables, for example, temperatures, pressures, and flows in an online operation, as illustrated from steps 222 to 228.

At 224, soft sensor values are computed and compared against lab values. In some implementations, for real-time closed-loop $H_2S$ control and optimization, the $H_2S$ value is calculated repeatedly approximately every 1-3 minutes. To validate the soft sensor's accuracy and robustness, the soft sensor value is checked at a regular interval, for example once a day, against the lab value. If the lab value is close or matches the soft sensor value, the soft sensor is confirmed and can continue to be used.

If the lab value is not close to the soft sensor value, from 224, the process 200 proceeds to 226, where whether the lab result is the correctly recorded lab result is verified. In some cases, there may be measurement uncertainty and random error associated with the manual sampling and laboratory analysis. Otherwise, an originally accurate soft sensor can quickly deteriorate due to an inaccurate lab value entered into the system. In some cases, sampling and laboratory errors can be introduced if operators entered not-carefully scrutinized, inaccurate laboratory values. These errors can be discovered by observing infrequent large up or down (positive or negative) swings in the lab bias over a short period of time (a few consecutive lab values) while the correct bias value, most of the time, may converge towards a small constant. Therefore, a questionable laboratory value, for example, a laboratory value that is quite different from the soft sensor value, should not be entered before re-confirmation from the laboratory by taking another sample. If the lab value is erroneously entered or recorded, the lab result is updated and the process 200 returns to 224 for another comparison.

If the lab value is accurate, from 226, the process 200 proceeds to 228, where the lab bias is adjusted. The lab results can be the input to the DCS that is used to update soft sensors as discussed previously in FIG. 6, for example, the input that feeds to synchronization block 612. The soft sensor updating operation in the DCS can be performed in real time and the system can continuously control $H_2S$ using the updated soft sensor without interruption.

In some cases, historical data can be further analyzed to adjust the soft sensors during maintenance operations, as shown in steps 230-232. The discrepancy may be caused by unmeasured disturbances or inaccurate soft sensor. While a few bias values may not pinpoint the cause, historical data analysis on lab bias values calculated and stored in the system over time can be used. At 232, the historical bias values are collected and analyzed. If the discrepancy is caused by unmeasured disturbances, the issue has already been self-corrected by the lab bias adjustment. On the other hand, if the discrepancy is caused by inaccurate soft sensor, the historical bias analysis can reveal how to adjust or recalibrate the soft sensor. From 232, the process 200 proceeds to 234, where soft sensor algorithms, for example, data point in Table 2, are adjusted. The adjustment can be easily done during the execution of the operation without shutting down the soft sensor. In some cases, the step 234 can be performed during the first 1-3 months after a new soft sensor implementation to further tune the soft sensor generation algorithm.

The single most important indication of soft sensor accuracy is through observation of the accumulated bias, which can be used to distinguish a lab bias error from a random error. A perfect soft sensor would have an accumulated bias close to zero while a good soft sensor should have an accumulated bias close to a small constant (can be a positive or negative value) with small variability. Lab biased soft sensors are susceptible to error due to the sometimes inconsistent sampling procedures and inherent statistical variability in the lab procedure itself.

Figure 7:
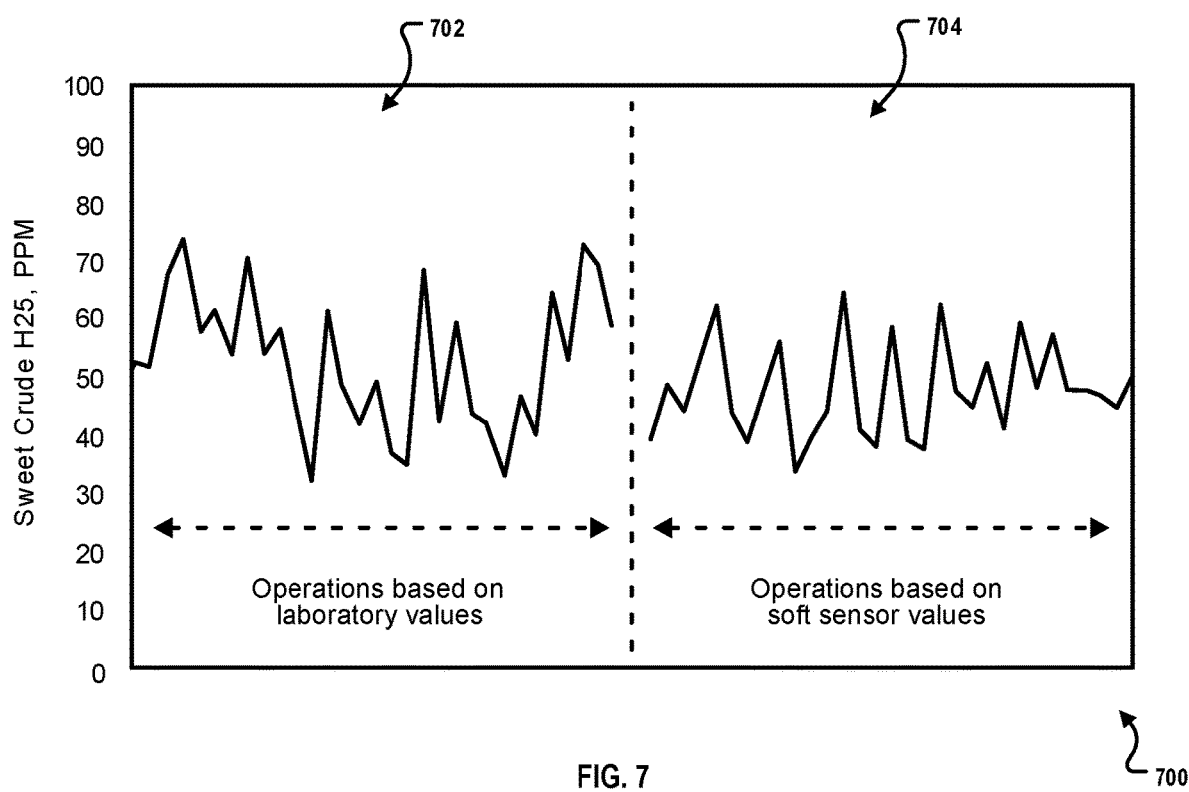
FIG. 7 illustrates an example comparison for operations based on laboratory values and soft sensor values, according to an implementation.

One advantage of the soft sensor built based on the process 200 is that measurement uncertainty and random error can be screened out. FIG. 7 illustrates an example comparison 700 for operations based on laboratory values, as shown in region 702, and soft sensor values, as shown in region 704, according to an implementation. To demonstrate the advantage, FIG. 7 illustrates 30 days of laboratory $H_2S$ values for operations based on the laboratory value and 30 days of laboratory $H_2S$ values for operations based on the soft sensor value. The $H_2S$ operating target during the two periods is about 50 PPM. As illustrated, operations based on the soft sensor value result in much smaller (about 33% reduction) $H_2S$ variability than operations based on the laboratory value. Table 3 provides additional information related to the comparison.

TABLE 3

|  | $H_2S$ Average | Standard Deviation | Coefficient of Variation |
| --- | --- | --- | --- |
| Operations based on laboratory values | 53.1 PPM | 10.5 PPM | 19.7% |
| Operations based on soft sensor values | 48.2 PPM | 6.4 PPM | 13.2% |

In some implementations, the $H_2S$ soft sensor generated using the process 200 can be used in Advanced Process Control (APC) on crude stabilization columns to automatically control the sweet crude's $H_2S$ content. The two stabilizer crude-out temperatures, which are closely related to the bottom temperature, and the one steam injection ratio can be adjusted based on the $H_2S$ soft sensor.

Figure 8:
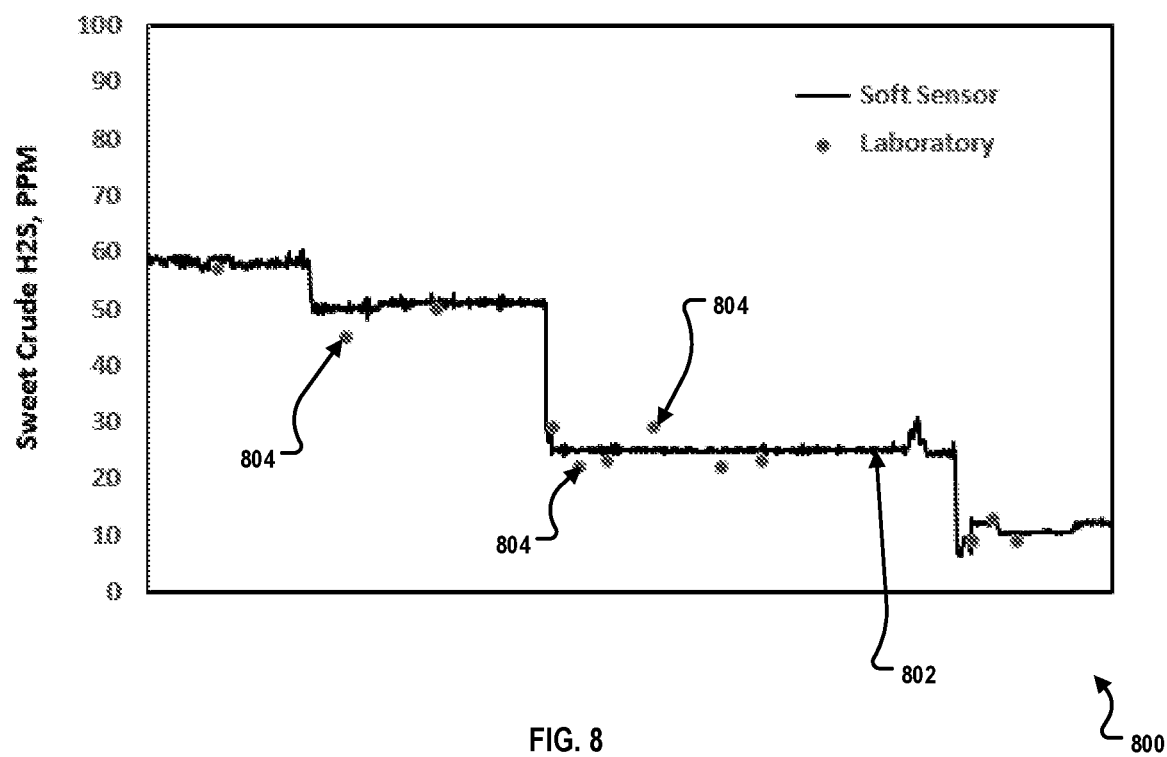
FIG. 8 illustrates an example control performance of a soft sensor, according to an implementation.

FIG. 8 illustrates an example of control performance 800 of a soft sensor, according to an implementation. The control performance 800 shown in FIG. 8 is recorded for a 2-week period that involves shallow stabilization and deep stabilization. As can be seen, the $H_2S$ target was changed several times during the illustrated period. The solid line 802 represents continuous real-time soft sensor values and the dots 804 represent scrutinized laboratory values used for spot check purposes. The average of the lab bias values is −1.6 PPM, which confirms the performance of the soft sensor developed by using the soft sensor generation process described in this disclosure.

Figure 9:
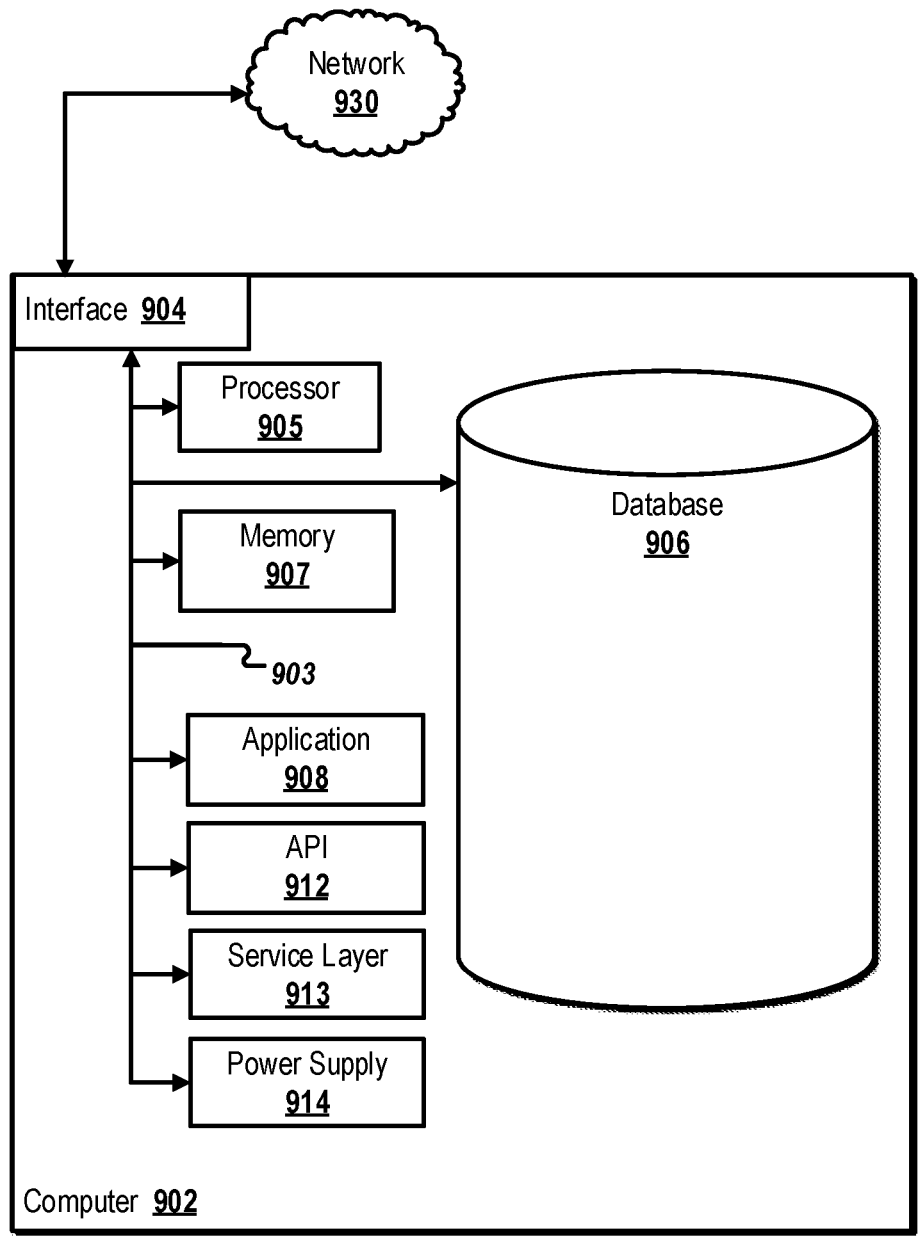
FIG. 9 is a block diagram illustrating an example computer system used to provide computational functionalities associated with described algorithms, methods, functions, processes, flows, and procedures as described in the instant disclosure, according to an implementation.

FIG. 9 is a block diagram of an example computer system 900 used to provide computational functionalities associated with described algorithms, methods, functions, processes, flows, and procedures, as described in the instant disclosure, according to an implementation. The computer system 900, or more than one computer system 900, can be used to implement the DCS described previously that generates or updates the soft sensor described in this disclosure. The computer system 900, or more than one computer system 900, can also be used to control the crude stabilization process using the soft sensors for real-time process control and optimization.

The illustrated computer 902 is intended to encompass any computing device such as a server, desktop computer, laptop/notebook computer, wireless data port, smart phone, personal data assistant (PDA), tablet computing device, one or more processors within these devices, or any other suitable processing device, including physical or virtual instances (or both) of the computing device. Additionally, the computer 902 may comprise a computer that includes an input device, such as a keypad, keyboard, touch screen, or other device that can accept user information, and an output device that conveys information associated with the operation of the computer 902, including digital data, visual, or audio information (or a combination of information), or a graphical user interface (GUI).

The computer 902 can serve in a role as a client, network component, a server, a database or other persistency, or any other component (or a combination of roles) of a computer system for performing the subject matter described in the instant disclosure. The illustrated computer 902 is communicably coupled with a network 930. In some implementations, one or more components of the computer 902 may be configured to operate within environments, including cloud-computing-based, local, global, or other environment (or a combination of environments).

At a high level, the computer 902 is an electronic computing device operable to receive, transmit, process, store, or manage data and information associated with the described subject matter. According to some implementations, the computer 902 may also include or be communicably coupled with an application server, e-mail server, web server, caching server, streaming data server, or other server (or a combination of servers).

The computer 902 can receive requests over network 930 from a client application (for example, executing on another computer 902) and respond to the received requests by processing the received requests using an appropriate software application(s). In addition, requests may also be sent to the computer 902 from internal users (for example, from a command console or by other appropriate access method), external or third-parties, other automated applications, as well as any other appropriate entities, individuals, systems, or computers.

Each of the components of the computer 902 can communicate using a system bus 903. In some implementations, any or all of the components of the computer 902, hardware or software (or a combination of both hardware and software), may interface with each other or the interface 904 (or a combination of both), over the system bus 903 using an application programming interface (API) 912 or a service layer 913 (or a combination of the API 912 and service layer 913). The API 912 may include specifications for routines, data structures, and object classes. The API 912 may be either computer-language independent or dependent and refer to a complete interface, a single function, or even a set of APIs. The service layer 913 provides software services to the computer 902 or other components (whether or not illustrated) that are communicably coupled to the computer 902. The functionality of the computer 902 may be accessible for all service consumers using this service layer. Software services, such as those provided by the service layer 913, provide reusable, defined functionalities through a defined interface. For example, the interface may be software written in JAVA, C++, or other suitable language providing data in extensible markup language (XML) format or other suitable format. While illustrated as an integrated component of the computer 902, alternative implementations may illustrate the API 912 or the service layer 913 as stand-alone components in relation to other components of the computer 902 or other components (whether or not illustrated) that are communicably coupled to the computer 902. Moreover, any or all parts of the API 912 or the service layer 913 may be implemented as child or sub-modules of another software module, enterprise application, or hardware module without departing from the scope of this disclosure.

The computer 902 includes an interface 904. Although illustrated as a single interface 904 in FIG. 9, two or more interfaces 904 may be used according to particular needs, desires, or particular implementations of the computer 902. The interface 904 is used by the computer 902 for communicating with other systems that are connected to the network 930 (whether illustrated or not) in a distributed environment. Generally, the interface 904 comprises logic encoded in software or hardware (or a combination of software and hardware) and is operable to communicate with the network 930. More specifically, the interface 904 may comprise software supporting one or more communication protocols associated with communications such that the network 930 or interface's hardware is operable to communicate physical signals within and outside of the illustrated computer 902.

The computer 902 includes a processor 905. Although illustrated as a single processor 905 in FIG. 9, two or more processors may be used according to particular needs, desires, or particular implementations of the computer 902. Generally, the processor 905 executes instructions and manipulates data to perform the operations of the computer 902 and any algorithms, methods, functions, processes, flows, and procedures as described in the instant disclosure.

The computer 902 also includes a database 906 that can hold data for the computer 902 or other components (or a combination of both) that can be connected to the network 930 (whether illustrated or not). For example, database 906 can be an in-memory, conventional, or other type of database storing data consistent with this disclosure. In some implementations, database 906 can be a combination of two or more different database types (for example, a hybrid in-memory and conventional database) according to particular needs, desires, or particular implementations of the computer 902 and the described functionality. Although illustrated as a single database 906 in FIG. 9, two or more databases (of the same or combination of types) can be used according to particular needs, desires, or particular implementations of the computer 902 and the described functionality. While database 906 is illustrated as an integral component of the computer 902, in alternative implementations, database 906 can be external to the computer 902.

The computer 902 also includes a memory 907 that can hold data for the computer 902 or other components (or a combination of both) that can be connected to the network 930 (whether illustrated or not). For example, memory 907 can be random access memory (RAM), read-only memory (ROM), optical, magnetic, and the like, storing data consistent with this disclosure. In some implementations, memory 907 can be a combination of two or more different types of memory (for example, a combination of RAM and magnetic storage) according to particular needs, desires, or particular implementations of the computer 902 and the described functionality. Although illustrated as a single memory 907 in FIG. 9, two or more memories 907 (of the same or combination of types) can be used according to particular needs, desires, or particular implementations of the computer 902 and the described functionality. While memory 907 is illustrated as an integral component of the computer 902, in alternative implementations, memory 907 can be external to the computer 902.

The application 908 is an algorithmic software engine providing functionality according to particular needs, desires, or particular implementations of the computer 902, particularly with respect to functionality described in this disclosure. For example, application 908 can serve as one or more components, modules, or applications. Further, although illustrated as a single application 908, the application 908 may be implemented as multiple applications 908 on the computer 902. In addition, although illustrated as integral to the computer 902, in alternative implementations, the application 908 can be external to the computer 902.

The computer 902 can also include a power supply 914. The power supply 914 can include a rechargeable or non-rechargeable battery that can be configured to be either user- or non-user-replaceable. In some implementations, the power supply 914 can include power-conversion or management circuits (including recharging, standby, or other power management functionality). In some implementations, the power-supply 914 can include a power plug to allow the computer 902 to be plugged into a wall socket or other power source to, for example, power the computer 902 or recharge a rechargeable battery.

There may be any number of computers 902 associated with, or external to, a computer system containing computer 902, each computer 902 communicating over network 930. Further, the term "client," "user," and other appropriate terminology may be used interchangeably, as appropriate, without departing from the scope of this disclosure. Moreover, this disclosure contemplates that many users may use one computer 902, or that one user may use multiple computers 902.

Described implementations of the subject matter can include one or more features, alone or in combination.

For example, in a first implementation, a computer-implemented method, comprising: generating a global theoretical graphical representation of a soft sensor based on a cursory model, wherein the soft sensor is used to control crude stabilization; generating a plurality of local real-life graphical representations for the soft sensor, each of the plurality of local real-life graphical representations corresponding to a respective local regime; generating a global real-life graphical representation for the soft sensor by combining the plurality of local real-life graphical representations; generating a set of numerical values for the soft sensor based on the global real-life graphical representation; updating the soft sensor based on lab results; and controlling a crude stabilization operation using the soft sensor.

The foregoing and other described implementations can each, optionally, include one or more of the following features:

A first feature, combinable with any of the following features, further comprising: identifying a primary input variable based on sensitivity study of the cursory model.

A second feature, combinable with any of the previous or following features, wherein the local regime is partitioned based on statistical analysis on historical data.

A third feature, combinable with any of the previous or following features, further comprising: performing statistical analysis on the lab results before updating the soft sensor based on the lab results.

A fourth feature, combinable with any of the previous or following features, wherein the soft sensor is a hydrogen sulfide ($H_2S$) sensor.

A fifth feature, combinable with any of the previous or following features, wherein controlling the crude stabilization operation using the soft sensor comprises controlling at least one of a stabilizer bottom temperature or a steam injection ratio.

A sixth feature, combinable with any of the previous or following features, wherein the soft sensor is a Reid vapor pressure (RVP) sensor.

In a second implementation, a non-transitory, computer-readable medium storing one or more instructions executable by a computer system to perform operations comprising: generating a global theoretical graphical representation of a soft sensor based on a cursory model, wherein the soft sensor is used to control crude stabilization; generating a plurality of local real-life graphical representations for the soft sensor, each of the plurality of local real-life graphical representations corresponding to a respective local regime; generating a global real-life graphical representation for the soft sensor by combining the plurality of local real-life graphical representations; generating a set of numerical values for the soft sensor based on the global real-life graphical representation; updating the soft sensor based on lab results; and controlling a crude stabilization operation using the soft sensor.

The foregoing and other described implementations can each, optionally, include one or more of the following features:

A first feature, combinable with any of the following features, the operations comprising: identifying a primary input variable based on sensitivity study of the cursory model.

A second feature, combinable with any of the previous or following features, wherein the local regime is partitioned based on statistical analysis on historical data.

A third feature, combinable with any of the previous or following features, the operations comprising: performing statistical analysis on the lab results before updating the soft sensor based on the lab results.

A fourth feature, combinable with any of the previous or following features, wherein the soft sensor is a hydrogen sulfide ($H_2S$) sensor.

A fifth feature, combinable with any of the previous or following features, wherein controlling the crude stabilization operation using the soft sensor comprises controlling at least one of a stabilizer bottom temperature or a steam injection ratio.

A sixth feature, combinable with any of the previous or following features, wherein the soft sensor is a Reid vapor pressure (RVP) sensor.

In a third implementation, a computer-implemented system, comprising:
a computer memory; and a hardware processor interoperably coupled with the computer memory and configured to perform operations comprising: generating a global theoretical graphical representation of a soft sensor based on a cursory model, wherein the soft sensor is used to control crude stabilization; generating a plurality of local real-life graphical representations for the soft sensor, each of the plurality of local real-life graphical representations corresponding to a respective local regime; generating a global real-life graphical representation for the soft sensor by combining the plurality of local real-life graphical representations; generating a set of numerical values for the soft sensor based on the global real-life graphical representation; updating the soft sensor based on lab results; and controlling a crude stabilization operation using the soft sensor.

The foregoing and other described implementations can each, optionally, include one or more of the following features:

A first feature, combinable with any of the following features, the operations comprising: identifying a primary input variable based on sensitivity study of the cursory model.

A second feature, combinable with any of the previous or following features, wherein the local regime is partitioned based on statistical analysis on historical data.

A third feature, combinable with any of the previous or following features, the operations comprising: performing statistical analysis on the lab results before updating the soft sensor based on the lab results.

A fourth feature, combinable with any of the previous or following features, wherein the soft sensor is a hydrogen sulfide ($H_2S$) sensor.

A fifth feature, combinable with any of the previous or following features, wherein controlling the crude stabilization operation using the soft sensor comprises controlling at least one of a stabilizer bottom temperature or a steam injection ratio.

A sixth feature, combinable with any of the previous or following features, wherein the soft sensor is a Reid vapor pressure (RVP) sensor.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring substantially simultaneously. For example, the time difference for a response to display (or for an initiation of a display) of data following the individual's action to access the data may be less than 1 ms, less than 1 sec., or less than 5 secs. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, IOS, or any other suitable conventional operating system.

A computer program, which may also be referred to or described as a program, software, a software application, a module, a software module, a script, or code can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components, as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM), or both. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory, as appropriate) suitable for storing computer program instructions and data includes all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and CD-ROM, DVD+/–R, DVD-RAM, and DVD-ROM disks. The memory may store various objects or data, including caches, classes, frameworks, applications, backup data, jobs, web pages, web page templates, database tables, repositories storing dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons. These and other UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with this disclosure), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain this disclosure. Other changes, substitutions, and alterations are also possible without departing from the spirit and scope of this disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A computer-implemented method, comprising:
   generating a global theoretical graphical representation of a soft sensor based on a cursory model;
   generating a plurality of local real-life graphical representations for the soft sensor based on the global theoretical graphical representation of the soft sensor, each of the plurality of local real-life graphical representations corresponding to a respective local regime;
   generating a global real-life graphical representation for the soft sensor by combining the plurality of local real-life graphical representations;
   generating a set of numerical values for the soft sensor based on the global real-life graphical representation;
   updating the soft sensor based on lab results and the set of numerical values; and
   using the updated soft sensor to control at least one of a stabilizer bottom temperature or a steam injection ratio in a crude production process.

2. The computer-implemented method of claim 1, further comprising: identifying a primary input variable based on sensitivity study of the cursory model.

3. The computer-implemented method of claim 1, wherein the local regime is partitioned based on statistical analysis on historical data.

4. The computer-implemented method of claim 1, further comprising: performing statistical analysis on the lab results before updating the soft sensor based on the lab results.

5. The computer-implemented method of claim 1, wherein the soft sensor is a hydrogen sulfide (H2S) sensor.

6. The computer-implemented method of claim 1, wherein the soft sensor is a Reid vapor pressure (RVP) sensor.

7. A non-transitory, computer-readable medium storing one or more instructions executable by a computer system to perform operations comprising:
   generating a global theoretical graphical representation of a soft sensor based on a cursory model;
   generating a plurality of local real-life graphical representations for the soft sensor based on the global theoretical graphical representation of the soft sensor, each of the plurality of local real-life graphical representations corresponding to a respective local regime;
   generating a global real-life graphical representation for the soft sensor by combining the plurality of local real-life graphical representations;
   generating a set of numerical values for the soft sensor based on the global real-life graphical representation;
   updating the soft sensor based on lab results and the set of numerical values; and
   using the updated soft sensor to control at least one of a stabilizer bottom temperature or a steam injection ratio in a crude production process.

8. The non-transitory, computer-readable medium of claim 7, the operations comprising: identifying a primary input variable based on sensitivity study of the cursory model.

9. The non-transitory, computer-readable medium of claim 7, wherein the local regime is partitioned based on statistical analysis on historical data.

10. The non-transitory, computer-readable medium of claim 7, the operations comprising: performing statistical analysis on the lab results before updating the soft sensor based on the lab results.

11. The non-transitory, computer-readable medium of claim 7, wherein the soft sensor is a hydrogen sulfide (H2S) sensor.

12. The non-transitory, computer-readable medium of claim 7, wherein the soft sensor is a Reid vapor pressure (RVP) sensor.

13. A computer-implemented system, comprising:
a computer memory; and
a hardware processor interoperably coupled with the computer memory and configured to perform operations comprising:
generating a global theoretical graphical representation of a soft sensor based on a cursory model;
generating a plurality of local real-life graphical representations for the soft sensor based on the global theoretical graphical representation of the soft sensor, each of the plurality of local real-life graphical representations corresponding to a respective local regime;
generating a global real-life graphical representation for the soft sensor by combining the plurality of local real-life graphical representations;
generating a set of numerical values for the soft sensor based on the global real-life graphical representation;
updating the soft sensor based on lab results and the set of numerical values; and
using the updated soft sensor to control at least one of a stabilizer bottom temperature or a steam injection ratio in a crude production process.

14. The computer-implemented system of claim 13, the operations comprising: identifying a primary input variable based on sensitivity study of the cursory model.

15. The computer-implemented system of claim 13, wherein the local regime is partitioned based on statistical analysis on historical data.

16. The computer-implemented system of claim 13, the operations comprising: performing statistical analysis on the lab results before updating the soft sensor based on the lab results.

17. The computer-implemented system of claim 13, wherein the soft sensor is a hydrogen sulfide (H2S) sensor.

* * * * *